United States Patent
Hasegawa

(10) Patent No.: US 6,574,785 B1
(45) Date of Patent: Jun. 3, 2003

(54) WIRING METHOD FOR SEMICONDUCTOR INTEGRATED CIRCUIT AND COMPUTER PRODUCT USING MAXIMUM GAP BETWEEN TIMES

(75) Inventor: Takao Hasegawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 64 days.

(21) Appl. No.: 09/722,691

(22) Filed: Nov. 28, 2000

(30) Foreign Application Priority Data

Jul. 7, 2000 (JP) ........................................ 2000-207092

(51) Int. Cl.[7] .............................................. G06F 17/50
(52) U.S. Cl. ........................................................ 716/13
(58) Field of Search ................................ 716/2, 4, 6, 8, 716/11–14; 326/40, 29; 714/733

(56) References Cited

U.S. PATENT DOCUMENTS 5,550,748 A * 8/1996 Xiong ........................... 716/13
5,798,656 A * 8/1998 Kean ............................. 326/39
5,923,676 A * 7/1999 Sunter et al. ................. 714/733
6,316,958 B1 * 11/2001 Jenkins, IV ................... 326/38

FOREIGN PATENT DOCUMENTS

| JP | 63-87744 | 4/1988 |
| JP | 4-137652 | 5/1992 |
| JP | 6-223134 | 8/1994 |

* cited by examiner

*Primary Examiner*—Matthew Smith
*Assistant Examiner*—Thuan Do
(74) *Attorney, Agent, or Firm*—Leydig, Voit & Mayer, Ltd.

(57) ABSTRACT

There is a standard for a timing gap between the timing of signals flowing in two signal lines and changing from low logic levels. The signal lines are made longer so that the timing gap between the times when signals flowing in the two signal lines change from their low logic levels is maximized yet within the standard.

19 Claims, 24 Drawing Sheets

WIRING METHOD FOR SEMICONDUCTOR INTEGRATED CIRCUIT AND COMPUTER PRODUCT USING MAXIMUM GAP BETWEEN TIMES

FIELD OF THE INVENTION

The present invention relates to a wiring method for a semiconductor integrated circuit with reduced noise and a computer product.

BACKGROUND OF THE INVENTION

FIG. 21 is a layout diagram of an example of a conventional semiconductor integrated circuit. This semiconductor integrated circuit includes elements 81, 82 and 83, a signal line 84 connecting the elements 81 and 83 with each other, and a signal line 85 connecting the elements 82 and 83 with each other. A predetermined standard for time operation guarantee and the like is prescribed for a time gap between a rise time or fall time of a signal that flows through the signal line 84 and a rise time or fall time of a signal that flows through the signal line 85. The signal lines 84 and 85 are kept as short as possible in order to easily achieve this standard.

FIG. 22 is a timing chart showing one example of signals that flow through the conventional signal lines 84 and 85. It is assumed, for example, that there is a prescribed standard of a51 sec as a gap between a timing that a signal A51 that flows through the signal line 84 rises from a low level to a high level and a timing that a signal B51 that flows through the signal line 85 rises from a low level to a high level. Since the signal lines 84 and 85 are wired as short as possible, the signals A51 and B51 rise steeply. Therefore, a time gap b51 sec between the rise time of the signal line A51 and the rise time of the signal line B51 becomes sufficiently small in comparison to the standard time gap a51 sec.

FIG. 23 is a timing chart showing another example of signals that flow through the conventional signal lines 84 and 85. It is assumed, for example, that there is a prescribed standard of a52 sec as a gap between a timing that a signal A52 that flows through the signal line 84 falls from a high level to a low level and a timing that a signal B52 that flows through the signal line 85 falls from a high level to a low level. Since the signal lines 84 and 85 are wired as short as possible, the signals A52 and B52 fall steeply. Therefore, a time gap b52 sec between the fall time of the signal line A52 and the fall time of the signal line B52 becomes sufficiently small as compared to the standard time gap of a52 sec.

FIG. 24 is a timing chart showing still another example of signals that flow through the conventional signal lines 84 and 85. It is assumed, for example, that there is a prescribed standard of a53 sec as a gap between a timing that a signal A53 that flows through the signal line 84 rises from a low level to a high level and a timing that a signal B53 that flows through the signal line 85 falls from a high level to a low level. Since the signal lines 84 and 85 are wired as short as possible, the signals A53 and B53 fall steeply. Therefore, a time gap b53 sec between the rise time of the signal line A53 and the fall time of the signal line B53 becomes sufficiently small as compared to the standard time gap of a53 sec.

According to the above prior-art techniques, the signal lines are wired as short as possible. As a consequence, the signals rise and fall steeply. When the signals rise and fall steeply like this, there is a drawback that overshoot or undershoot is generated which results into an increase in the noise.

SUMMARY OF THE INVENTION

It is an object of the present invention to provide a wiring method for a semiconductor integrated circuit with reduced noise by suppressing occurrences of overshoot and undershoot, and a computer-readable recording medium storing a program for making the computer execute this method.

In the wiring method for a semiconductor integrated circuit according to one aspect of the present invention, signal lines are wired to maximize a gap in timing between the signal lines within a predetermined standard, thereby slowing a rise and a fall of signals.

In the wiring method for a semiconductor integrated circuit according to another aspect of the present invention, the lengths of signal lines are extended to maximize a gap in timing between the signal lines within a predetermined standard, thereby slowing a rise and a fall of signals.

In the wiring method for a semiconductor integrated circuit according to still another aspect of the present invention, the widths of signal lines are expanded to maximize a gap in timing between the signal lines within a predetermined standard, thereby slowing a rise and a fall of signals.

In the wiring method for a semiconductor integrated circuit according to still another aspect of the present invention, one or a plurality of through-holes are provided on signal lines to maximize a gap in timing between the signal lines within a predetermined standard, thereby slowing a rise and a fall of signals.

In the wiring method for a semiconductor integrated circuit according to still another aspect of the present invention, signal lines are branched to maximize a gap in timing between the signal lines within a predetermined standard, thereby slowing a rise and a fall of signals.

In the wiring method for a semiconductor integrated circuit according to still another aspect of the present invention, signal lines are provided with one or a plurality of parallel routes to maximize a gap in timing between the signal lines within a predetermined standard, thereby slowing a rise and a fall of signals.

A computer-readable recording medium according to still another aspect of the present invention is recorded with a program for making the computer execute any one of the above methods relating to the invention. With this arrangement, it is possible to make the computer execute the methods of the above-described methods relating to the invention.

In this case, the "computer-readable recording medium" includes a "portable physical medium" such as a magnetic disk like a floppy disk, a semiconductor memory (including that incorporated in a cartridge or a PC card) like a ROM, an EPROM, an EEPROM, a flash ROM, etc., an optical disk like a CD-ROM, a DVD, etc., an optical magnetic disk like an MO, etc., and a "fixed physical medium" like a ROM, a RAM, a hard disk, etc. that are incorporated in various types of computer systems.

Further, the "computer-readable recording medium" may also include a communication medium for short-time holding a program like a communication line for transmitting a program via a network like a LAN, a WAN, Internet, etc. The "program" is a one that describes a data processing method. A language to be described and a describing method are not particularly limited, and formats of a source code, a binary code and an execution format are not limited. Further, the "program" is not necessarily limited to a one formed in a single structure, but also includes a distributed structure as a plurality of modules and libraries, and a program that achieves its function in co-operation with separate programs of an OS and the like.

Other objects and features of this invention will become apparent from the following description with reference to the accompanying drawings.

DESCRIPTION OF THE PREFERRED EMBODIMENTS

Embodiments of the present invention will be explained in detail with reference to the drawings. However, the present invention is not limited to these embodiments.

Figure 1:
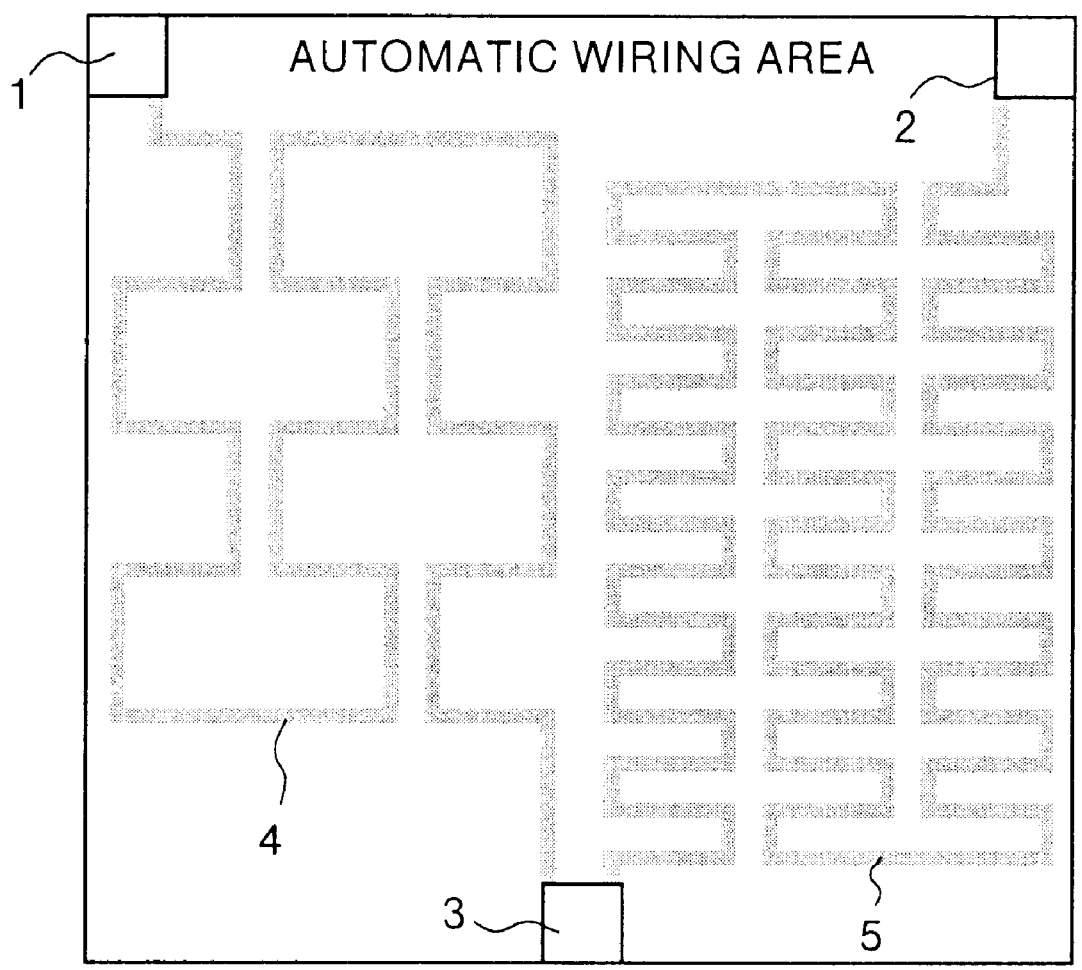
FIG. 1 is a layout diagram showing one example of a semiconductor integrated circuit relating to a first embodiment of the present invention.

FIG. 1 is a layout diagram of an example of a semiconductor integrated circuit relating to a first embodiment of the present invention. This semiconductor integrated circuit includes elements 1, 2 and 3, a signal line 4 connecting the elements 1 and 3 with each other, and a signal line 5 connecting the elements 2 and 3 with each other. A predetermined standard for the operation guarantee and the like is prescribed for a time gap between a rise or fall timing of a signal that flows through the signal line 4 and a rise or fall timing of a signal that flows through the signal line 5. In the wiring of this semiconductor integrated circuit, the lengths of these signal lines are extended (made redundant) to maximize (or set to a value close to a maximum value) a gap in timing between the signal lines within a predetermined standard.

Figure 2:
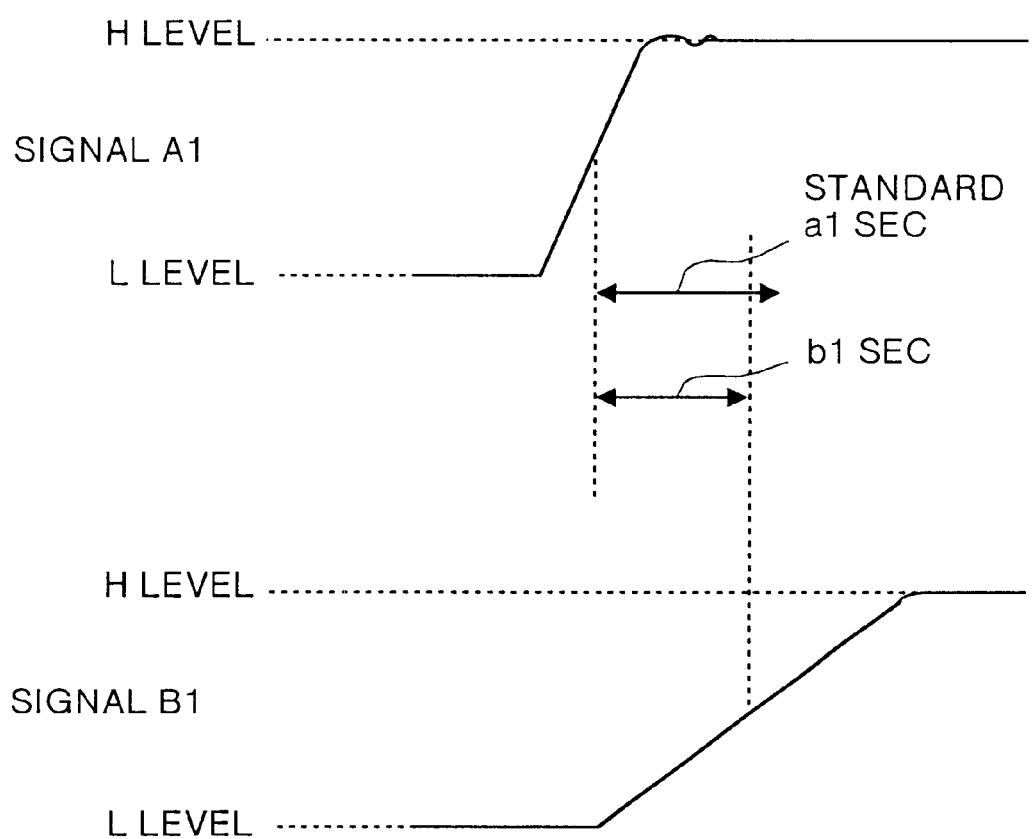
FIG. 2 is a timing chart showing one example of signals in signal lines relating to the first embodiment of the invention.

In the above structure, the operation of the first embodiment will be explained with reference to timing charts shown in FIG. 2 to FIG. 4. FIG. 2 is a timing chart showing one example of signals that flow through the signal lines 4 and 5 relating to the first embodiment. It is assumed, for example, that there is a prescribed standard of a1 sec as a gap between a timing that a signal A1 that flows through the signal line 4 rises from a low level to a high level and a timing that a signal B1 that flows through the signal line 5 rises from a low level to a high level. Since the signal lines are long, the signals A1 and B1 rise gently. As a consequence, a timing gap b1 sec between the signal lines becomes only slightly smaller than the standard timing gap of a1 sec. Thus, since the signals A1 and B1 rise gently, overshoot or undershoot does not occur.

Figure 3:
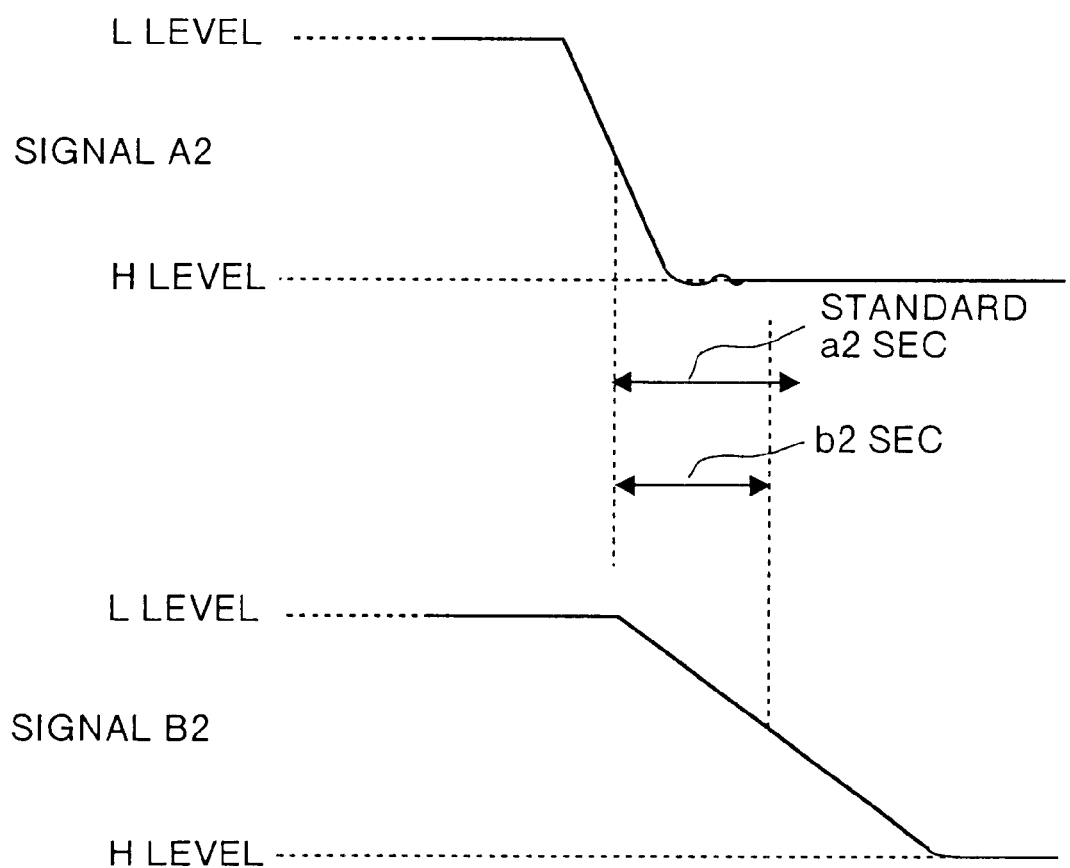
FIG. 3 is a timing chart showing another example of signals in signal lines relating to the first embodiment of the invention.

FIG. 3 is a timing chart showing another example of signals that flow through the signal lines 4 and 5 relating to the first embodiment. It is assumed, for example, that there is a prescribed standard of a2 sec as a gap between a timing that a signal A2 that flows through the signal line 4 falls from a high level to a low level and a timing that a signal B2 that flows through the signal line 5 falls from a high level to a low level. Since the signal lines are long, the fall of the signals A2 and B2 becomes gentle. As a consequence, a timing gap b2 sec between the signal lines becomes only slightly smaller than the standard timing gap of a2 sec. Thus, since the fall of the signals A2 and B2 is gentle, overshoot or undershoot does not occur.

Figure 4:
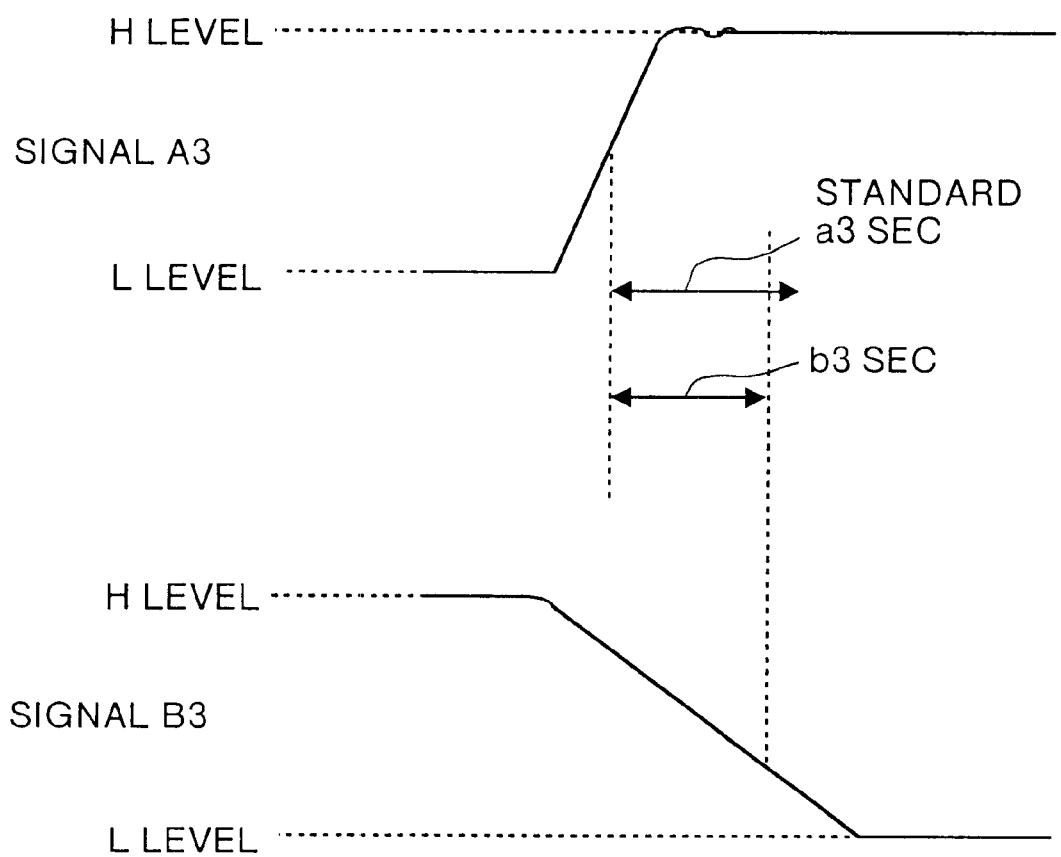
FIG. 4 is a timing chart showing still another example of signals in signal lines relating to the first embodiment of the invention.

FIG. 4 is a timing chart showing still another example of signals that flow through the signal lines 4 and 5 relating to the first embodiment. It is assumed, for example, that there is a prescribed standard of a3 sec as a gap between a timing that a signal A3 that flows through the signal line 4 rises from a low level to a high level and a timing that a signal B3 that flows through the signal line 5 falls from a high level to a low level. Since the signal lines are long, the signal A3 rises gently and the signal B3 falls gently. As a consequence, a timing gap b3 sec between the signal lines becomes only slightly smaller than the standard timing gap of a3 sec. Thus, since the signal A3 rises gently and the signal B3 falls gently, overshoot or undershoot does not occur.

As described above, according to the first embodiment, as the lengths of signal lines are extended to maximize a gap in timing between the signal lines within a predetermined standard thereby slowing a rise and a fall of signals, it is possible to reduce noise by suppressing the occurrence of an overshoot and an undershoot.

Figure 5:
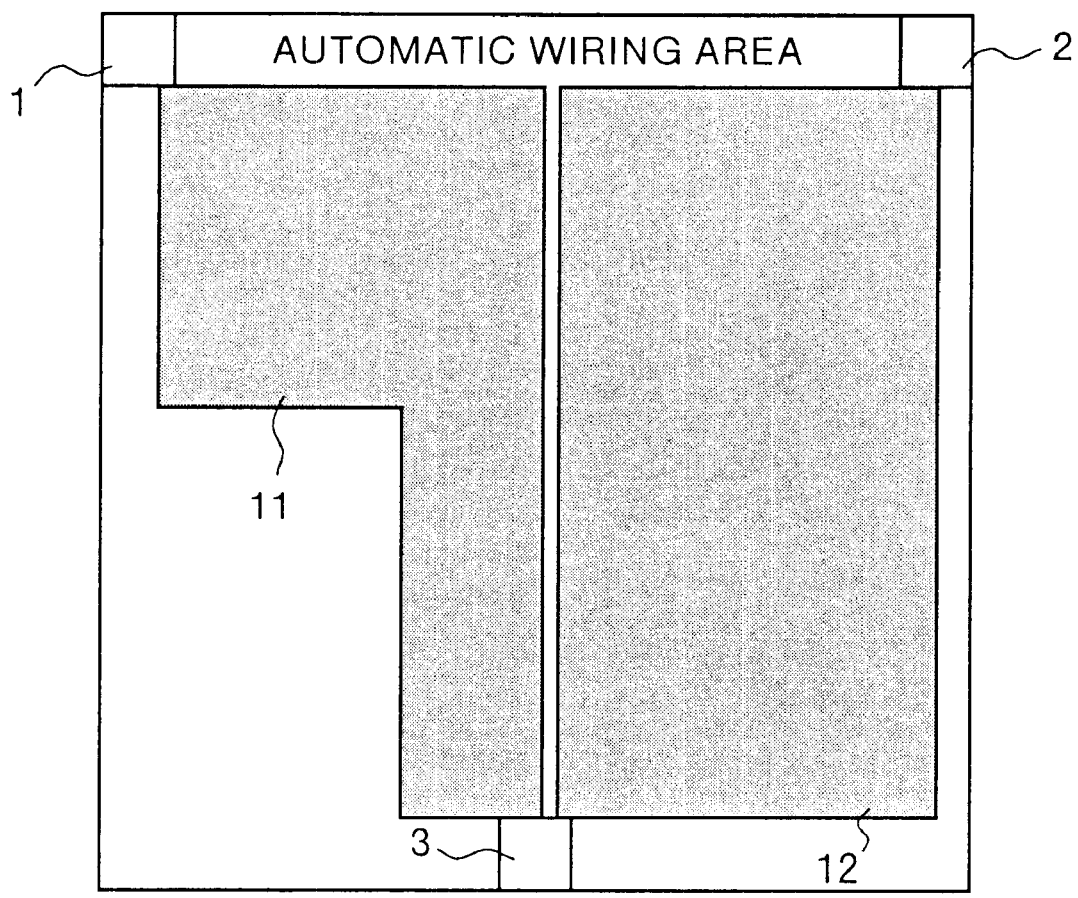
FIG. 5 is a layout diagram showing one example of a semiconductor integrated circuit relating to a second embodiment of the present invention.

FIG. 5 is a layout diagram showing one example of a semiconductor integrated circuit relating to a second embodiment of the present invention. This semiconductor integrated circuit includes elements 1, 2 and 3, a signal line 11 connecting the elements 1 and 3 with each other, and a signal line 12 connecting the elements 2 and 3 with each other. A predetermined standard for the operation guarantee and the like is prescribed for a time gap between a rise or fall timing of a signal that flows through the signal line 11 and a rise or fall timing of a signal that flows through the signal line 12. In the wiring of this semiconductor integrated circuit, the widths of these signal lines are expanded to maximize (or set to a value close to a maximum value) a gap in timing between the signal lines within a predetermined standard.

Figure 6:
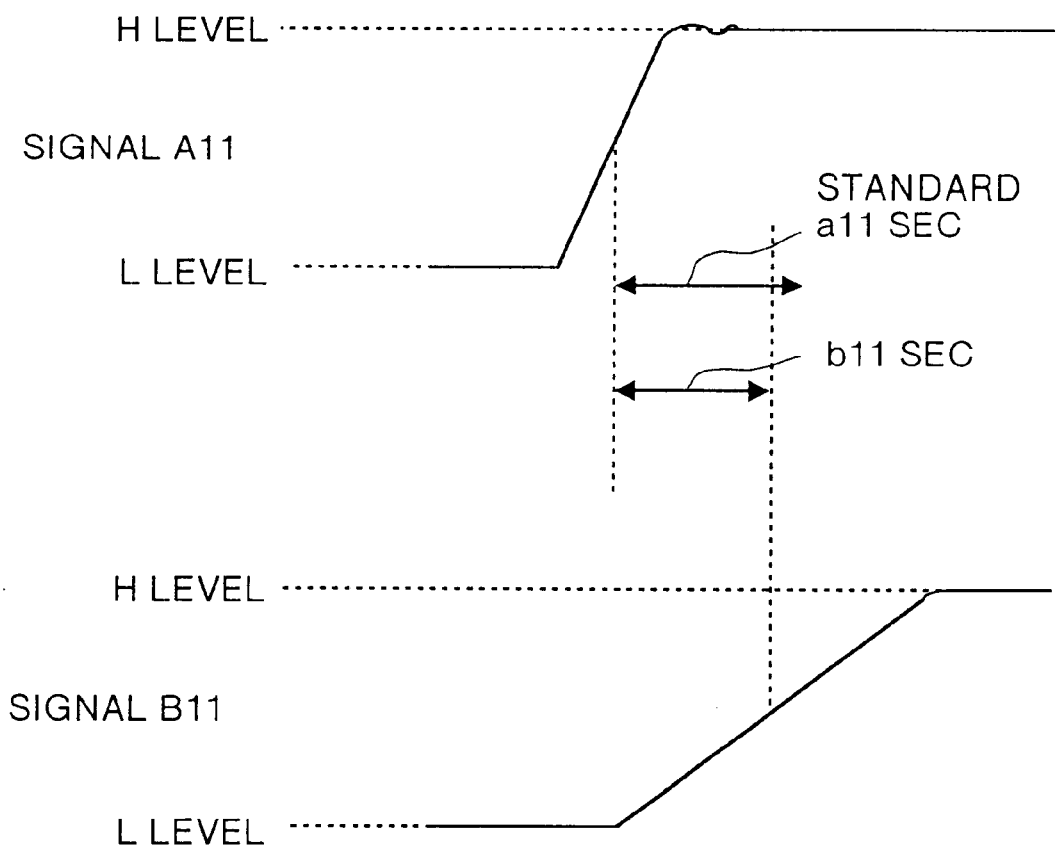
FIG. 6 is a timing chart showing one example of signals in signal lines relating to the second embodiment of the invention.

The operation of the second embodiment will be explained with reference to timing charts shown in FIG. 6 to FIG. 8. FIG. 6 is a timing chart showing one example of signals that flow through the signal lines 11 and 12 relating to the second embodiment. It is assumed, for example, that there is a prescribed standard of a11 sec as a gap between a timing that a signal A11 that flows through the signal line 11 rises from a low level to a high level and a timing that a signal B11 that flows through the signal line 12 rises from a low level to a high level. Since the signal lines are long, the signals A11 and B11 rise gently. As a consequence, a timing gap b11 sec between the signal lines becomes only slightly smaller than the standard timing gap of a11 sec. Thus, since the signals A11 and B11 rise gently, overshoot or undershoot does not occur.

Figure 7:
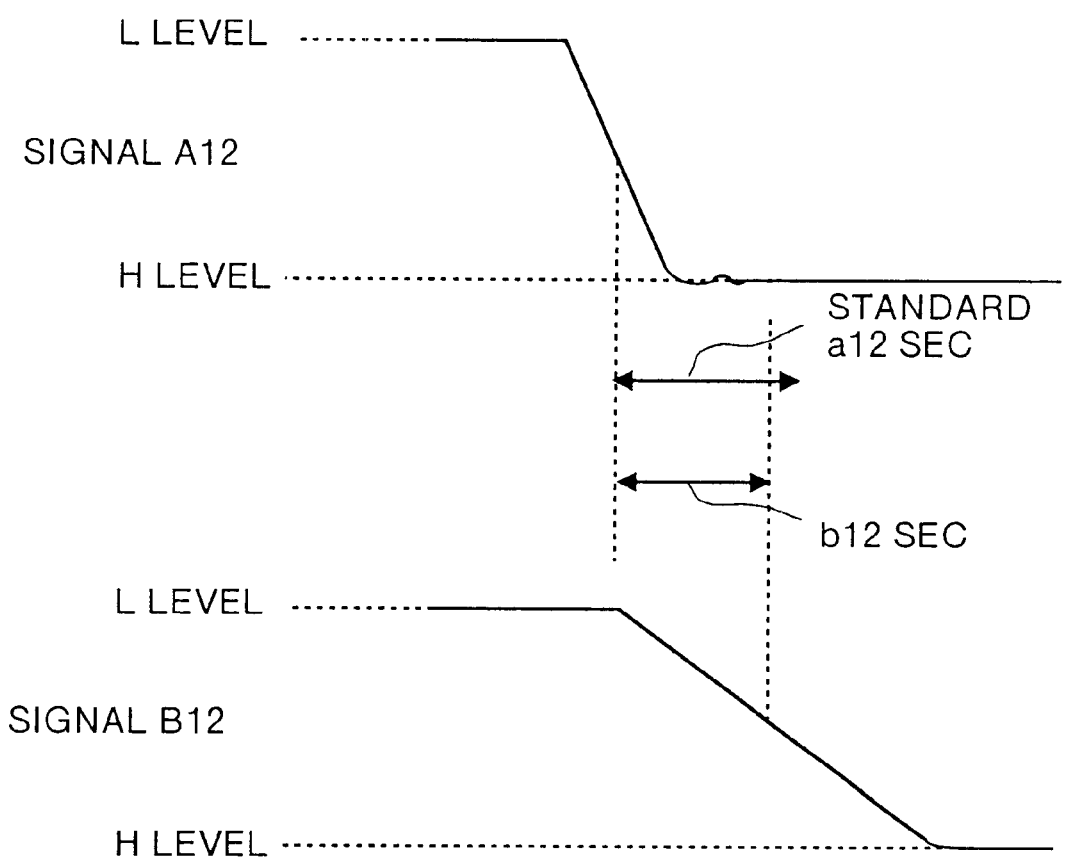
FIG. 7 is a timing chart showing another example of signals in signal lines relating to the second embodiment of the invention.

FIG. 7 is a timing chart showing another example of signals that flow through the signal lines 11 and 12 relating to the second embodiment. It is assumed, for example, that there is a prescribed standard of a12 sec as a gap between a timing that a signal A12 that flows through the signal line 11 falls from a high level to a low level and a timing that a signal B12 that flows through the signal line 12 falls from a high level to a low level. Since the signal lines are long, the fall of the signals A12 and B12 is gentle. As a consequence, a timing gap b12 sec between the signal lines becomes only slightly smaller than the standard timing gap of a12 sec. Thus, since the fall of the signals A12 and B12 is gentle, it is possible to suppress the occurrence of overshoot or undershoot.

Figure 8:
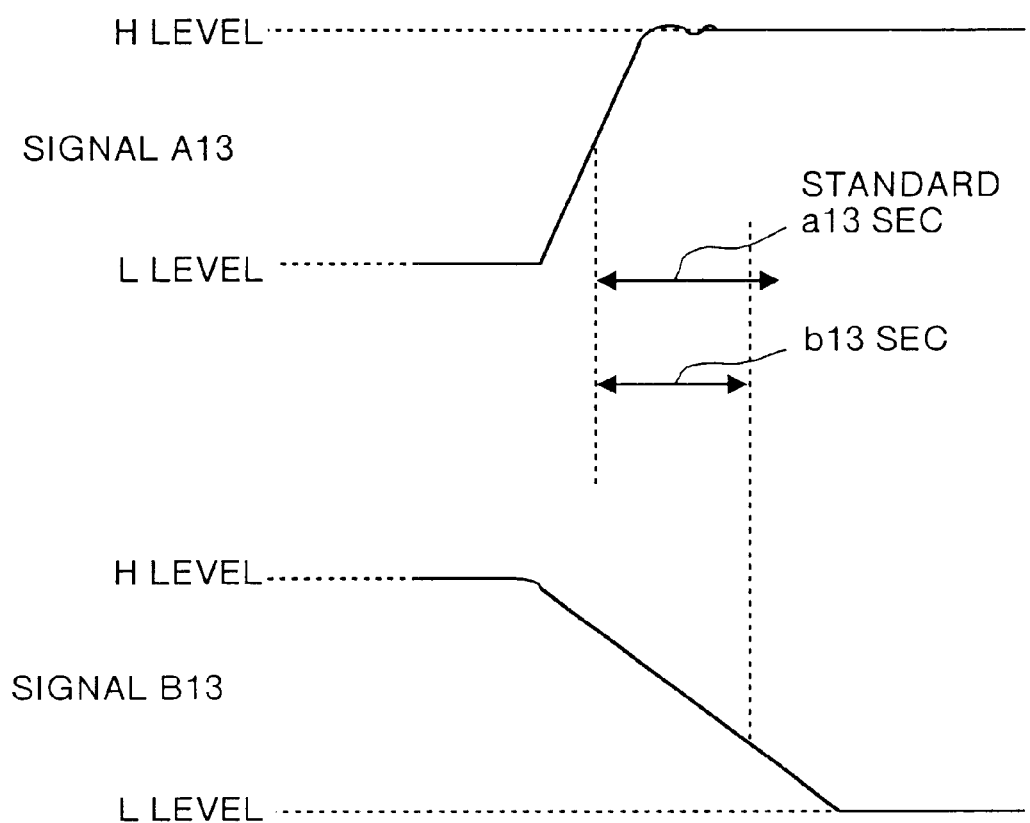
FIG. 8 is a timing chart showing still another example of signals in signal lines relating to the second embodiment of the invention.

FIG. 8 is a timing chart showing still another example of signals that flow through the signal lines 11 and 12 relating to the second embodiment. It is assumed, for example, that there is a prescribed standard of a13 sec as a gap between a timing that a signal A13 that flows through the signal line 11 rises from a low level to a high level and a timing that a signal B13 that flows through the signal line 12 falls from a high level to a low level. Since the signal lines are long, the signal A13 rises gently and the signal B13 falls gently. As a consequence, a timing gap b13 sec between the signal lines becomes only slightly smaller than the standard timing gap of a13 sec. Thus, since the signal A13 rises gently and the signal B13 falls gently, overshoot or undershoot does not occur.

As described above, according to the second embodiment, as the widths of signal lines are expanded to maximize a gap in timing between the signal lines within a predetermined standard thereby slowing a rise and a fall of signals, it is possible to reduce noise by suppressing the occurrence of an overshoot and an undershoot.

Figure 9:
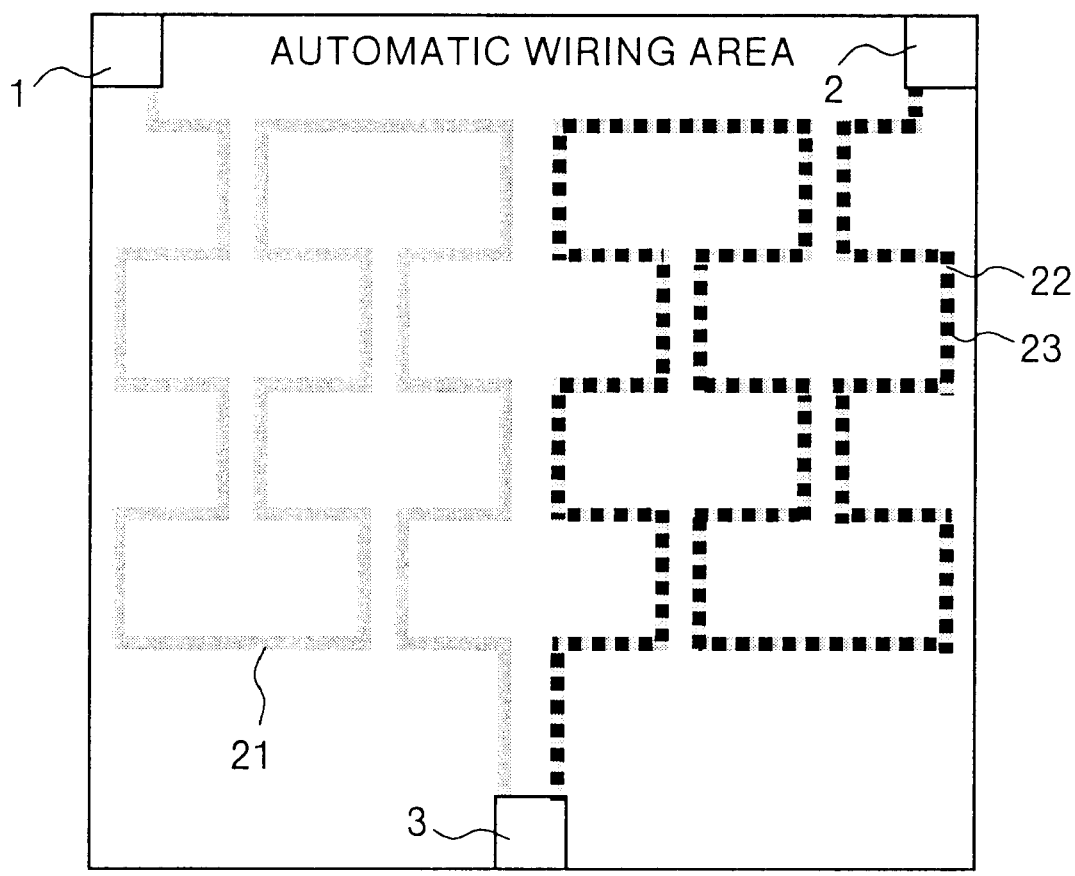
FIG. 9 is a layout diagram showing one example of a semiconductor integrated circuit relating to a third embodiment of the present invention.

FIG. 9 is a layout diagram showing one example of a semiconductor integrated circuit relating to a third embodiment of the present invention. This semiconductor integrated circuit includes elements 1, 2 and 3, a signal line 21 for connecting between the element 1 and the element 3, and a signal line 22 for connecting between the element 2 and the element 3. A predetermined standard for the operation guarantee and the like is prescribed for a time gap between a rise or fall timing of a signal that flows through the signal line 21 and a rise or fall timing of a signal that flows through the signal line 22. In the wiring of this semiconductor integrated circuit, at least one of these signal lines is, provided with at least one through-hole 23 to maximize (or set to a value close to a maximum value) a gap in timing between the signal lines within a predetermined standard.

Figure 10:
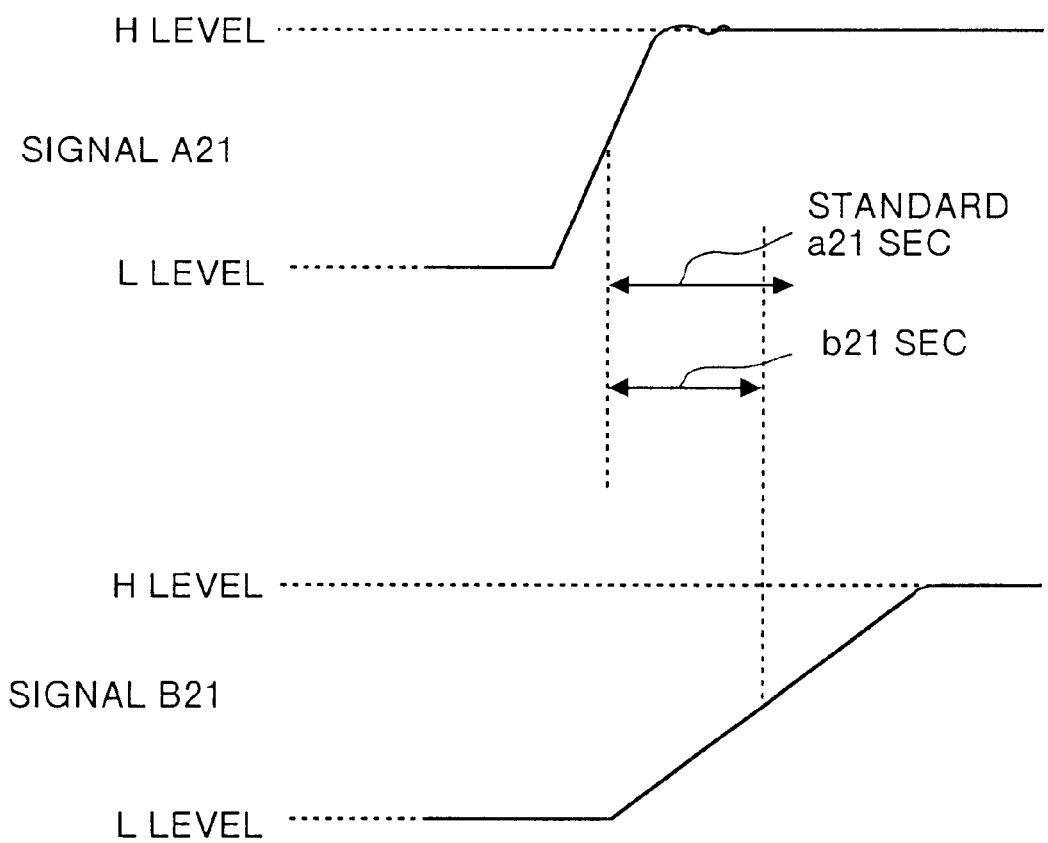
FIG. 10 is a timing chart showing one example of signals in signal lines relating to the third embodiment of the invention.

The operation of the third embodiment will be explained with reference to timing charts shown in FIG. 10 to FIG. 12. FIG. 10 is a timing chart showing one example of signals that flow through the signal lines 21 and 22 relating to the third embodiment. It is assumed, for example, that there is a prescribed standard of a21 sec as a gap between a timing that a signal A21 that flows through the signal line 21 rises from a low level to a high level and a timing that a signal B21 that flows through the signal line 22 rises from a low level to a high level. Since the signal lines are long and the through-hole 23 is provided on at least one of the signal lines in this semiconductor integrated circuit, the signals A21 and B21 rise gently. As a consequence, a timing gap b21 sec between the signal lines becomes only slightly smaller than the standard timing gap of a21 sec. Thus, since the signals A21 and B21 rise gently, overshoot or undershoot does not occur.

Figure 11:
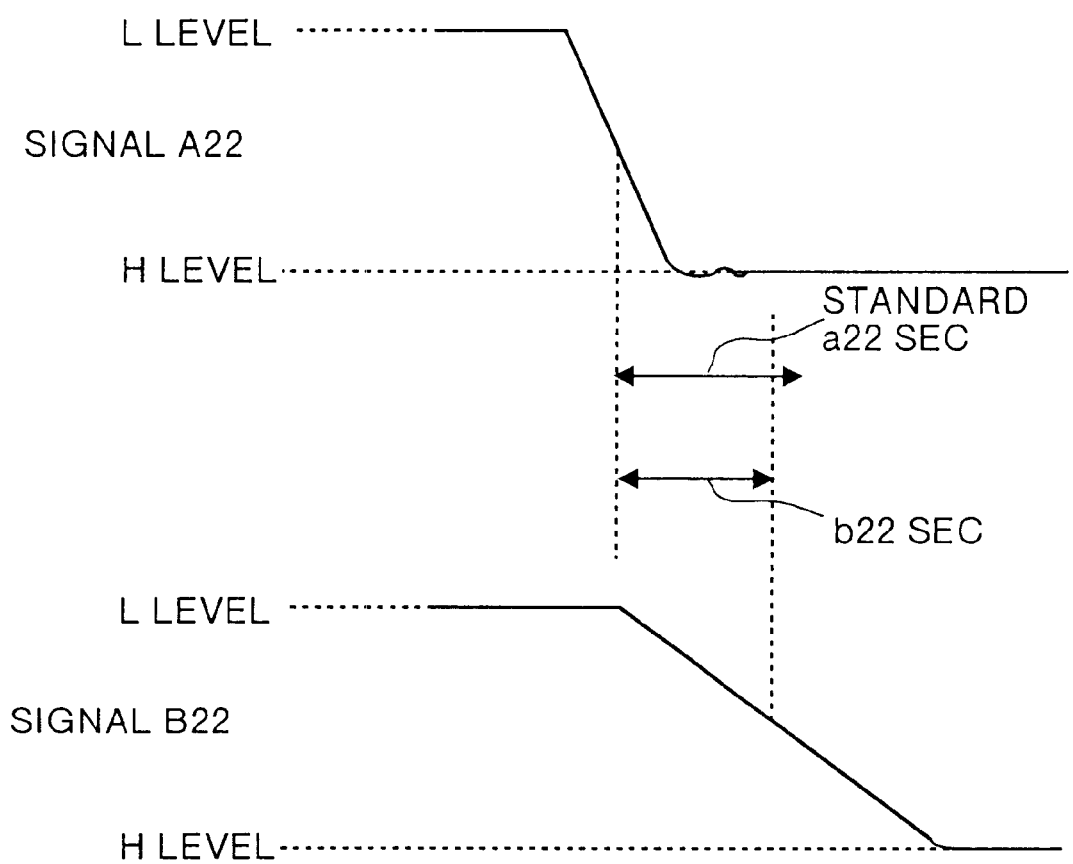
FIG. 11 is a timing chart showing another example of signals in signal lines relating to the third embodiment of the invention.

FIG. 11 is a timing chart showing another example of signals that flow through the signal lines 21 and 22 relating to the third embodiment. It is assumed, for example, that there is a prescribed standard of a22 sec as a gap between a timing that a signal A22 that flows through the signal line 21 falls from a high level to a low level and a timing that a signal B22 that flows through the signal line 22 falls from a high level to a low level. Since the signal lines are long and the through-hole 23 is provided on at least one of the signal lines in this semiconductor integrated circuit, the fall of the signals A22 and B22 is gentle. As a consequence, a timing gap b22 sec between the signal lines becomes only slightly smaller than the standard timing gap of a22 sec. Thus, since the fall of the signals A22 and B22 is gentle, it is possible to suppress the occurrence of overshoot or undershoot.

Figure 12:
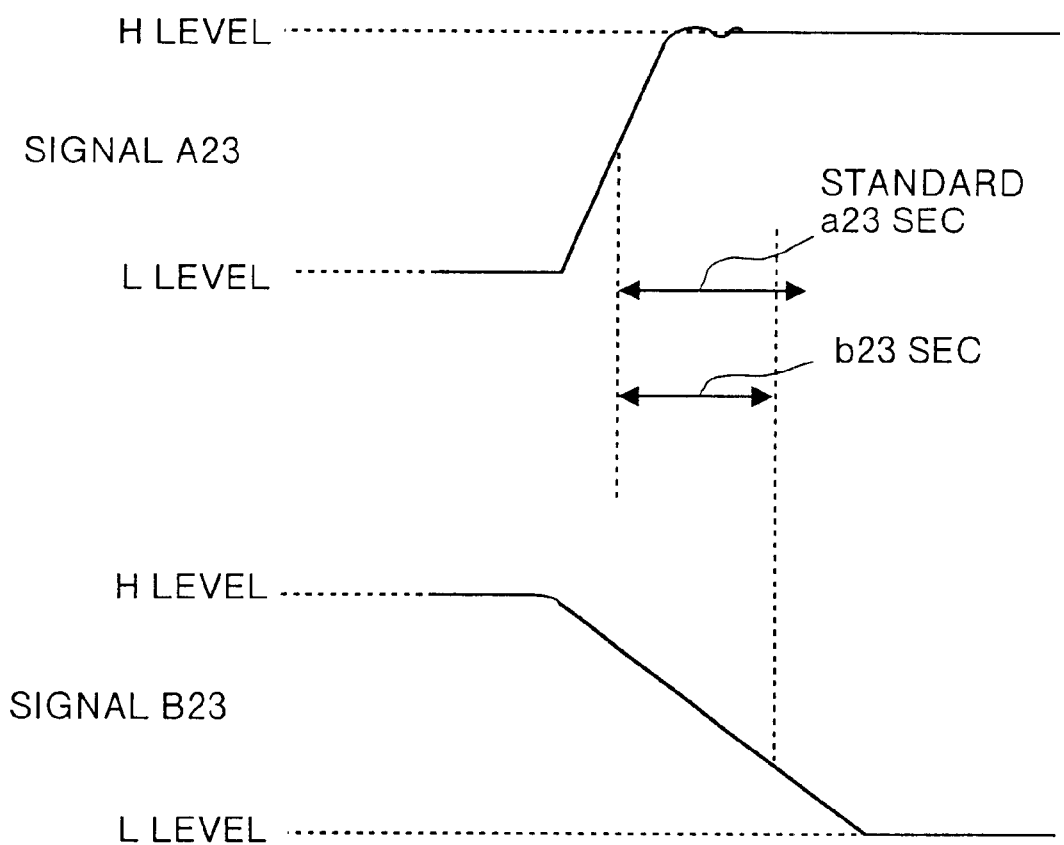
FIG. 12 is a timing chart showing still another example of signals in signal lines relating to the third embodiment of the invention.

FIG. 12 is a timing chart showing still another example of signals that flow through the signal lines 21 and 22 relating to the third embodiment. It is assumed, for example, that there is a prescribed standard of a23 sec as a gap between a timing that a signal A23 that flows through the signal line 21 rises from a low level to a high level and a timing that a signal B23 that flows through the signal line 22 falls from a high level to a low level. Since the signal lines are long and the through-hole 23 is provided on at least one of the signal lines in this semiconductor integrated circuit, the signal A23 rises gently and the signal B23 falls gently. As a consequence, a timing gap b23 sec between the signal lines becomes only slightly smaller than the standard timing gap of a23 sec. Thus, since the signal A23 rises gently and the signal B23 falls gently, overshoot or undershoot does not occur.

As described above, according to the third embodiment, as the through-hole 23 is provided on at least one of the signal lines to maximize a gap in timing between the signal lines within a predetermined standard thereby slowing a rise and a fall of signals, it is possible to reduce noise by suppressing the occurrence of an overshoot and an undershoot.

Figure 13:
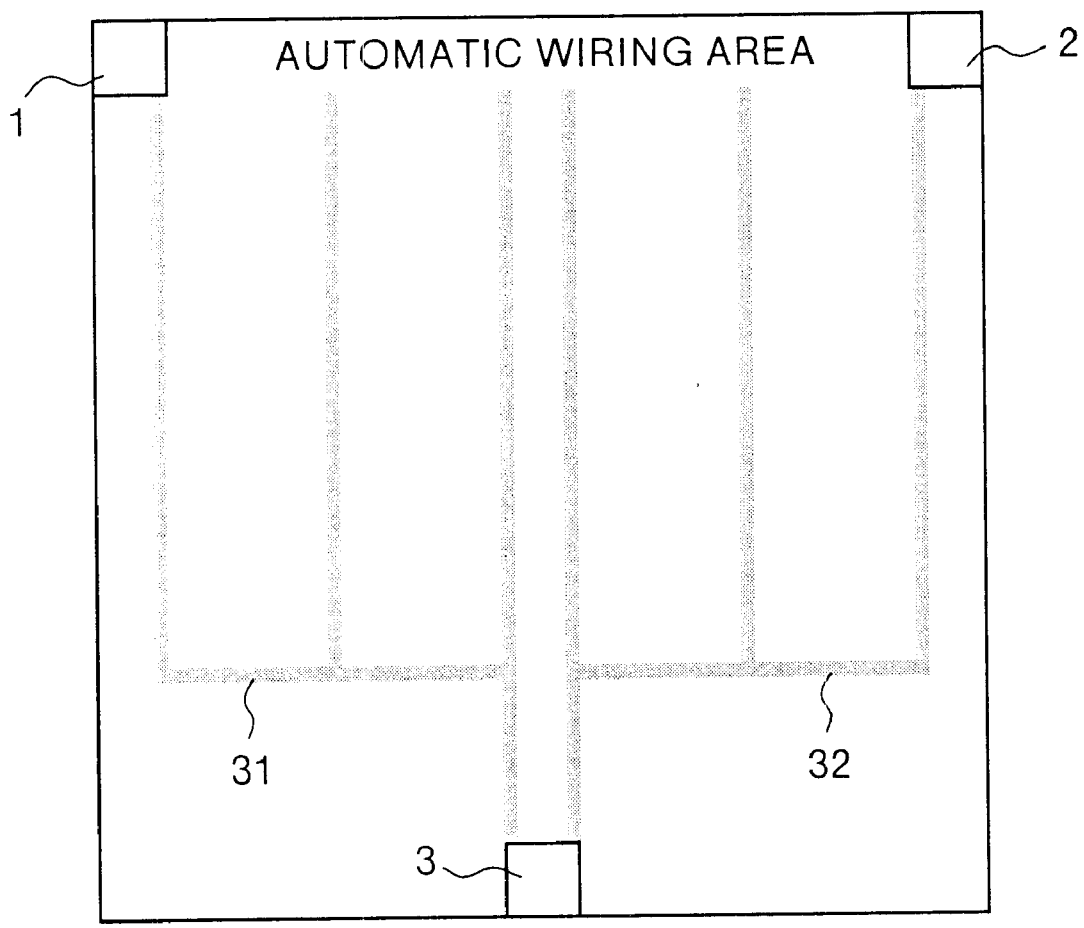
FIG. 13 is a layout diagram showing one example of a semiconductor integrated circuit relating to a fourth embodiment of the present invention.

FIG. 13 is a layout diagram showing one example of a semiconductor integrated circuit relating to a fourth embodiment of the present invention. This semiconductor 10 integrated circuit includes elements 1, 2 and 3, a signal line 31 connecting the elements land 3 with each other, and a signal line 32 connecting the elements 2 and 3 with each other. A predetermined standard for the operation guarantee and the like is prescribed for a time gap between a rise or fall timing of a signal that flows through the signal line 31 and a rise or fall timing of a signal that flows through the signal line 32. In the wiring of this semiconductor integrated circuit, surplus branch wires are added to these signal lines to maximize (or set to a value close to a maximum value) a gap in timing between the signal lines within a predetermined standard.

Figure 14:
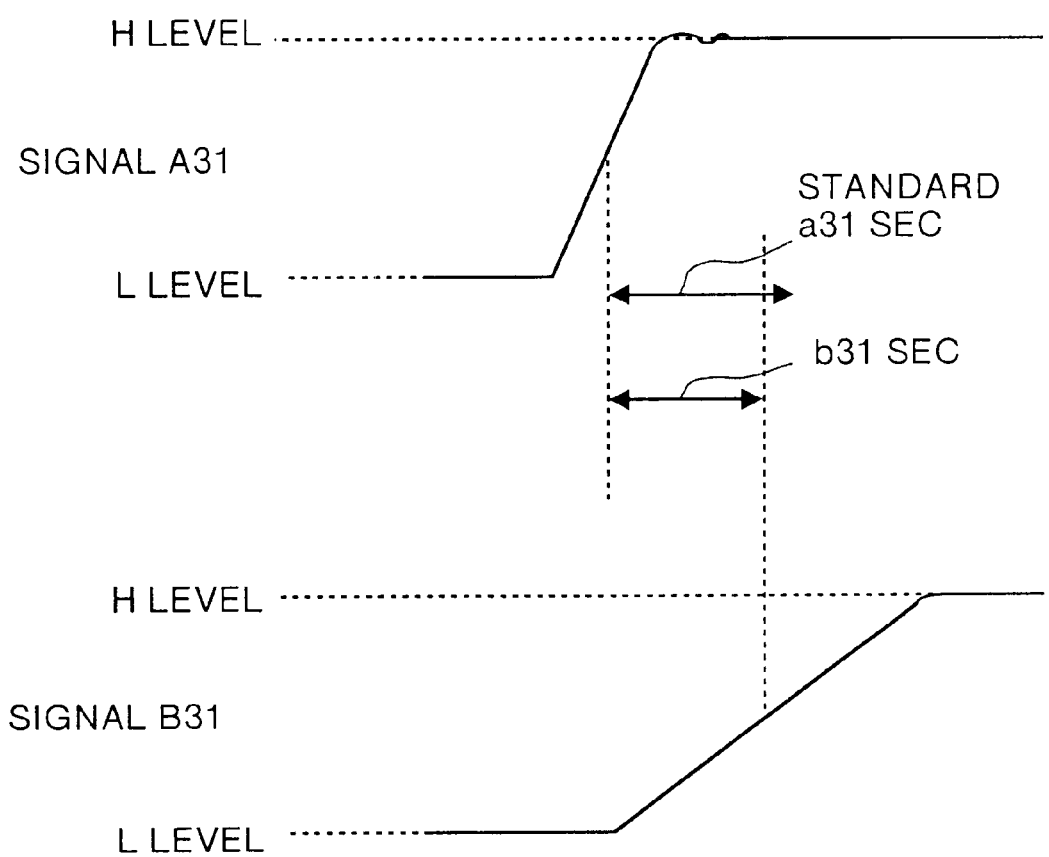
FIG. 14 is a timing chart showing one example of signals in signal lines relating to the fourth embodiment of the invention.

The operation of the fourth embodiment will be explained with reference to timing charts shown in FIG. 14 to FIG. 16. FIG. 14 is a timing chart showing one example of signals that flow through the signal lines 31 and 32 relating to the fourth embodiment. It is assumed, for example, that there is a prescribed standard of a31 sec as a gap between a timing that a signal A31 that flows through the signal line 31 rises from a low level to a high level and a timing that a signal B31 that flows through the signal line 32 rises from a low level to a high level. Since surplus branch wires are added to these signal lines in this semiconductor integrated circuit, the signals A31 and B31 rise gently. As a consequence, a timing gap b31 sec between the signal lines becomes only slightly smaller than the standard timing gap of a31 sec. Thus, since the signals A31 and B31 rise gently, overshoot or undershoot does not occur.

Figure 15:
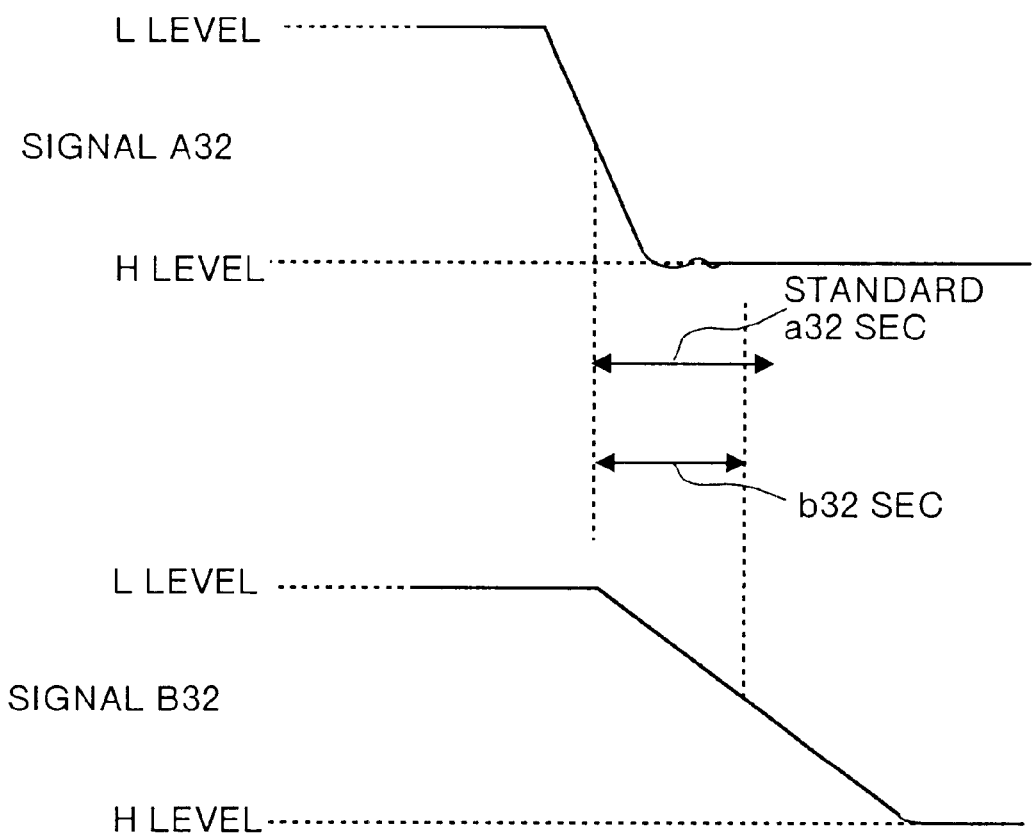
FIG. 15 is a timing chart showing another example of signals in signal lines relating to the fourth embodiment of the invention.

FIG. 15 is a timing chart showing another example of signals that flow through the signal lines 31 and 32 relating to the fourth embodiment. It is assumed, for example, that there is a prescribed standard of a32 sec as a gap between a timing that a signal A32 that flows through the signal line 31 falls from a high level to a low level and a timing that a signal B32 that flows through the signal line 32 falls from a high level to a low level. Since the surplus branch wires are added to these signal lines in this semiconductor integrated circuit, the fall of the signals A32 and B32 becomes gentle. As a consequence, a timing gap b32 sec between the signal lines becomes only slightly smaller than the standard timing gap of a32 sec. Thus, since the fall of the signals A32 and B32 is gentle, it is possible to suppress the occurrence of overshoot or undershoot.

Figure 16:
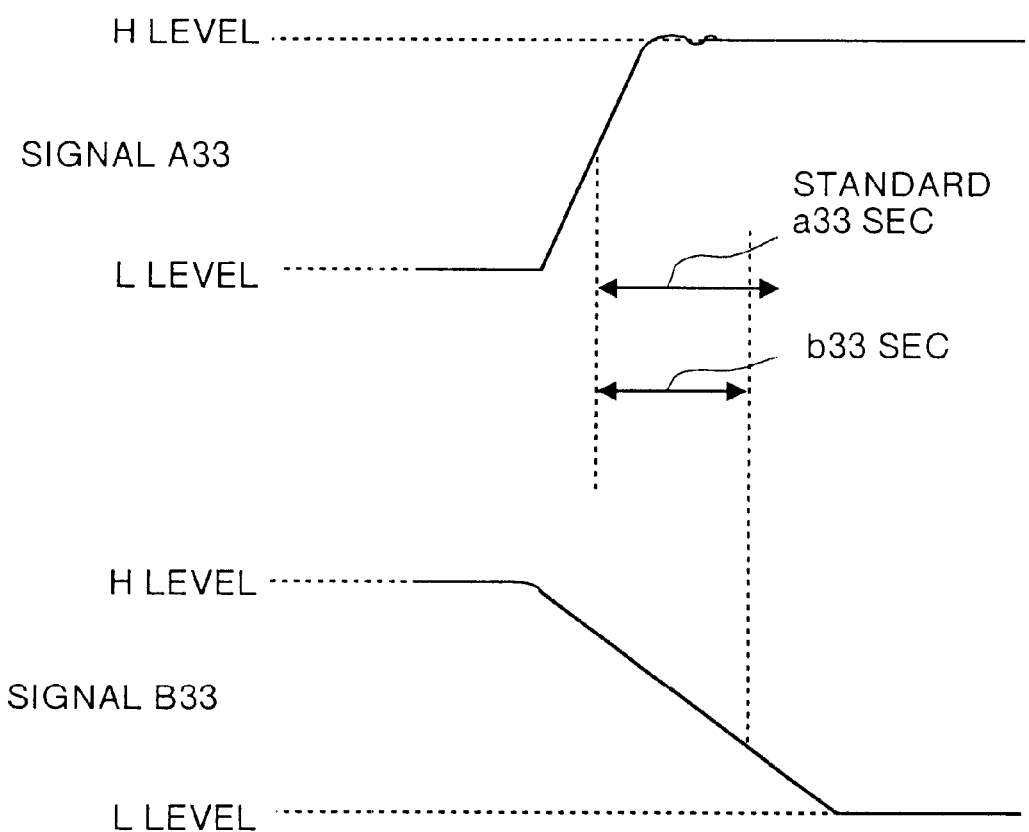
FIG. 16 is a timing chart showing still another example of signals in signal lines relating to the fourth embodiment of the invention.

FIG. 16 is a timing chart showing still another example of signals that flow through the signal lines 31 and 32 relating to the fourth embodiment. It is assumed, for example, that there is a prescribed standard of a33 sec as a gap between a timing that a signal A33 that flows through the signal line 31 rises from a low level to a high level and a timing that a signal B33 that flows through the signal line 32 falls from a high level to a low level. Since the surplus branch wires are added to these signal lines in this semiconductor integrated circuit, the signal A33 rises gently and the signal B33 falls gently. As a consequence, a timing gap b33 sec between the signal lines becomes only slightly smaller than the standard timing gap of a33 sec. Thus, since the signal A33 rises gently and the signal B33 falls gently, overshoot or undershoot does not occur.

As described above, according to the fourth embodiment, as one or a plurality of branches are provided on the signal lines to maximize a gap in timing between the signal lines within a predetermined standard thereby slowing a rise and a fall of signals, it is possible to reduce noise by suppressing the occurrence of an overshoot and an undershoot.

Figure 17:
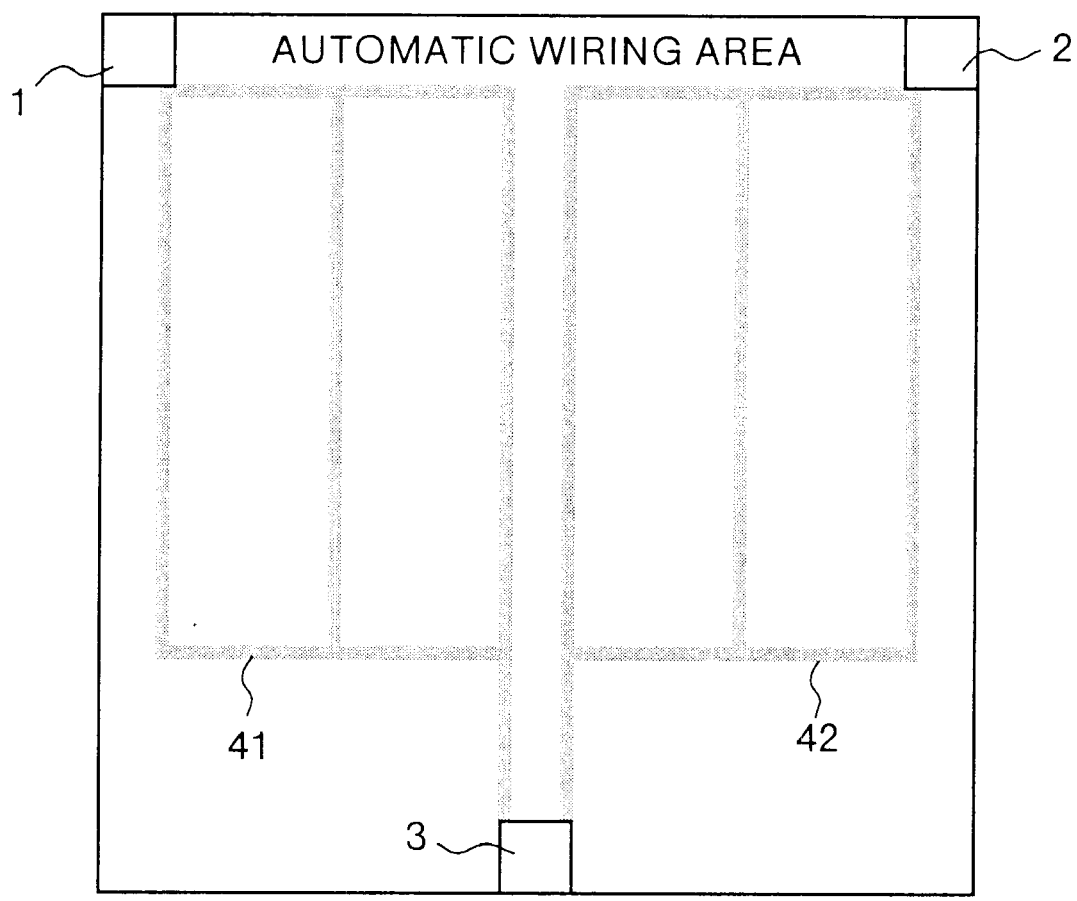
FIG. 17 is a layout diagram showing one example of a semiconductor integrated circuit relating to a fifth embodiment of the present invention.

FIG. 17 is a layout diagram showing one example of a semiconductor integrated circuit relating to a fifth embodiment of the present invention. This semiconductor integrated circuit includes elements 1, 2 and 3, a signal line 41 connecting the elements 1 and 3 with each other, and a signal line 42 connecting the elements 1 and 3 with each other. A 5 predetermined standard for the operation guarantee and the like is prescribed for a time gap between a rise or fall timing of a signal that flows through the signal line 41 and a rise or fall timing of a signal that flows through the signal line 42. In the wiring of this semiconductor integrated circuit, surplus branch wires are added to these signal lines, and the end points of these branches are connected together. In other words, these signal lines are provided with one or a plurality of parallel paths, thereby to maximize (or set to a value close to a maximum value) a gap in timing between the signal lines within a predetermined standard.

Figure 18:
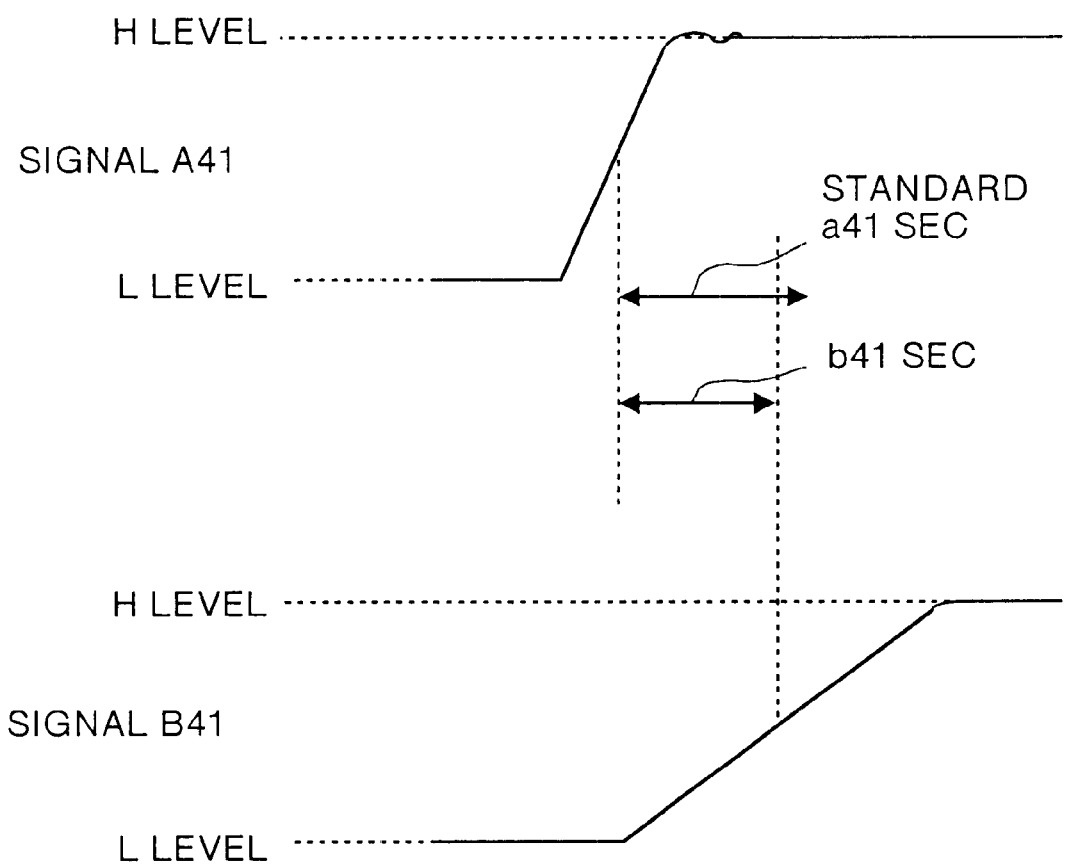
FIG. 18 is a timing chart showing one example of signals in signal lines relating to the fifth embodiment of the invention.

The operation of the fifth embodiment will be explained with reference to timing charts shown in FIG. 18 to FIG. 20. FIG. 18 is a timing chart showing one example of signals that flow through the signal lines 41 and 42 relating to the fifth embodiment. It is assumed, for example, that there is a prescribed standard of a41 sec as a gap between a timing that a signal A41 that flows through the signal line 41 rises from a low level to a high level and a timing that a signal B41 that flows through the signal line 42 rises from a low level to a high level. Since these signal lines are provided with one or a plurality of parallel paths in this semiconductor integrated circuit, the signals A41 and B41 rise gently. As a consequence, a timing gap b41 sec between the signal lines becomes only slightly smaller than the standard timing gap of a41 sec. Thus, since the signals A41 and B41 rise gently, overshoot or undershoot does not occur.

Figure 19:
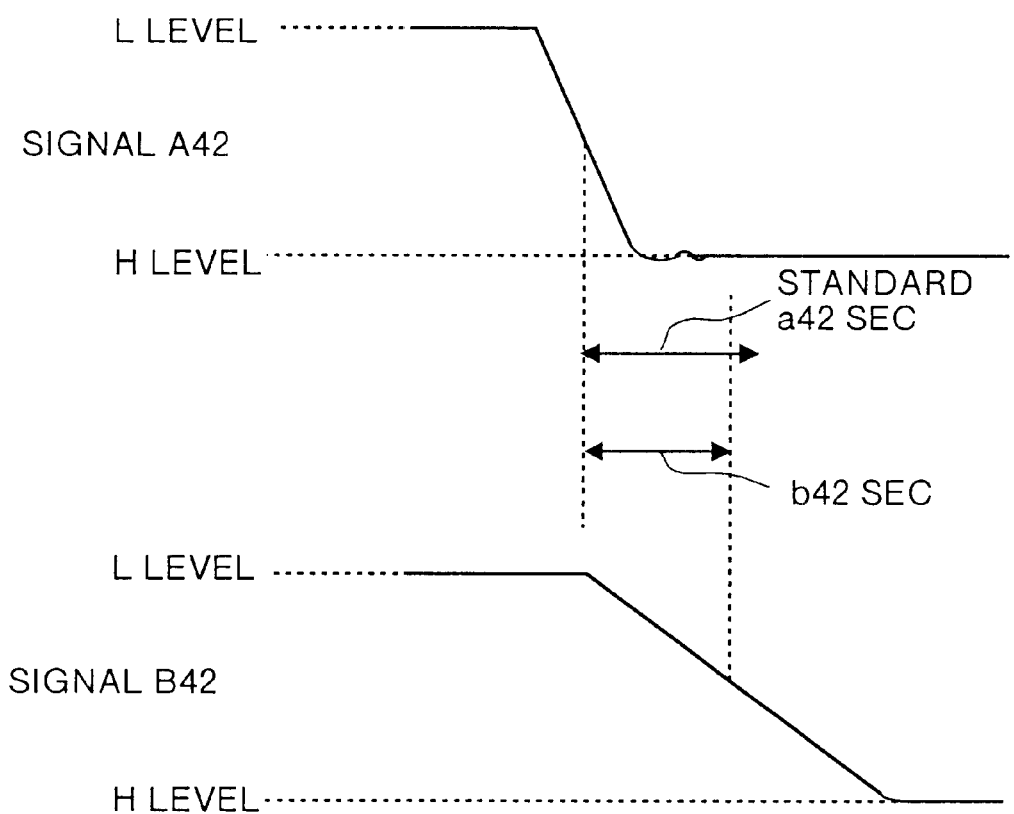
FIG. 19 is a timing chart showing another example of signals in signal lines relating to the fifth embodiment of the invention.

FIG. 19 is a timing chart showing another example of signals that flow through the signal lines 41 and 42 relating to the fifth embodiment. It is assumed, for example, that there is a prescribed standard of a42 sec as a gap between a timing that a signal A42 that flows through the signal line 41 falls from a high level to a low level and a timing that a signal B42 that flows through the signal line 42 falls from a high level to a low level. Since these signal lines are provided with one or a plurality of parallel paths in this semiconductor integrated circuit, the fall of the signals A42 and B42 becomes gentle. As a consequence, a timing gap b42 sec between the signal lines becomes only slightly smaller than the standard timing gap of a42 sec. Thus, since the signals A42 and B42 fall gently, it is possible to suppress the occurrence of overshoot or undershoot.

Figure 20:
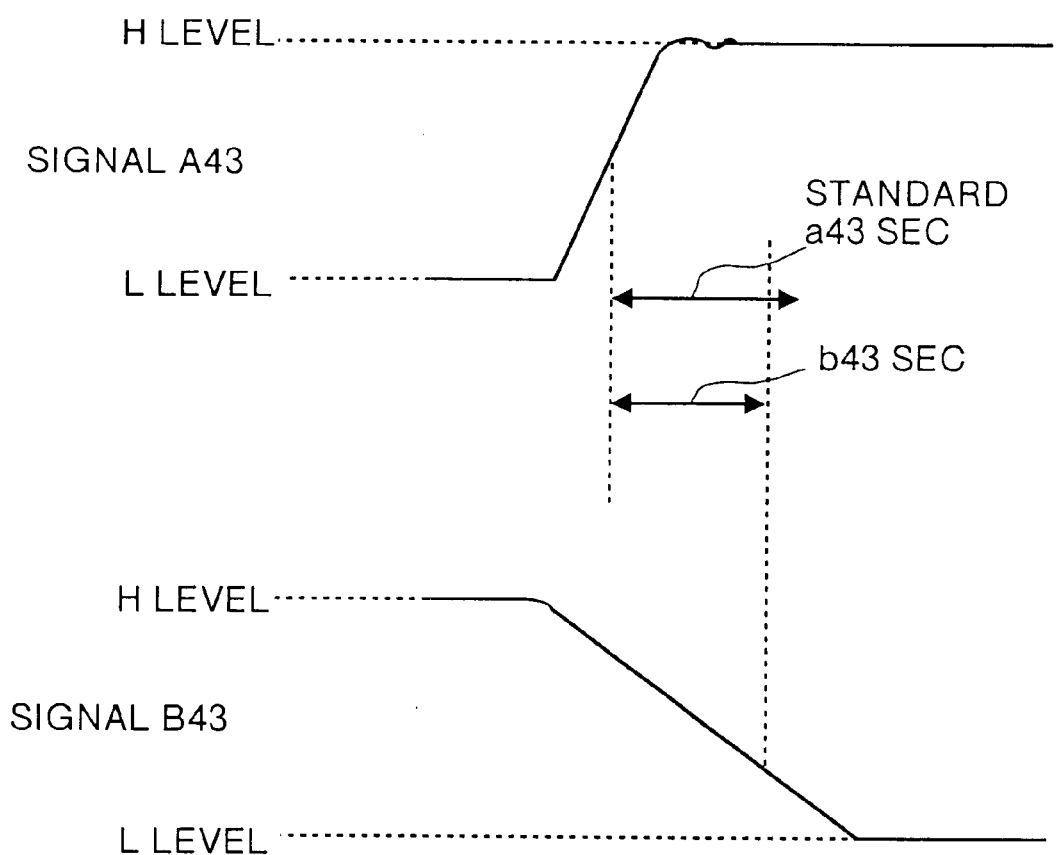
FIG. 20 is a timing chart showing still another example of signals in signal lines relating to the fifth embodiment of the invention.
Figure 21:
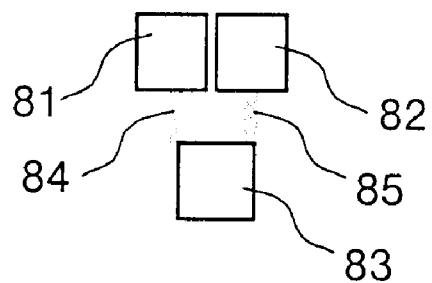
FIG. 21 is a layout diagram showing one example of a conventional semiconductor integrated circuit.
Figure 22:
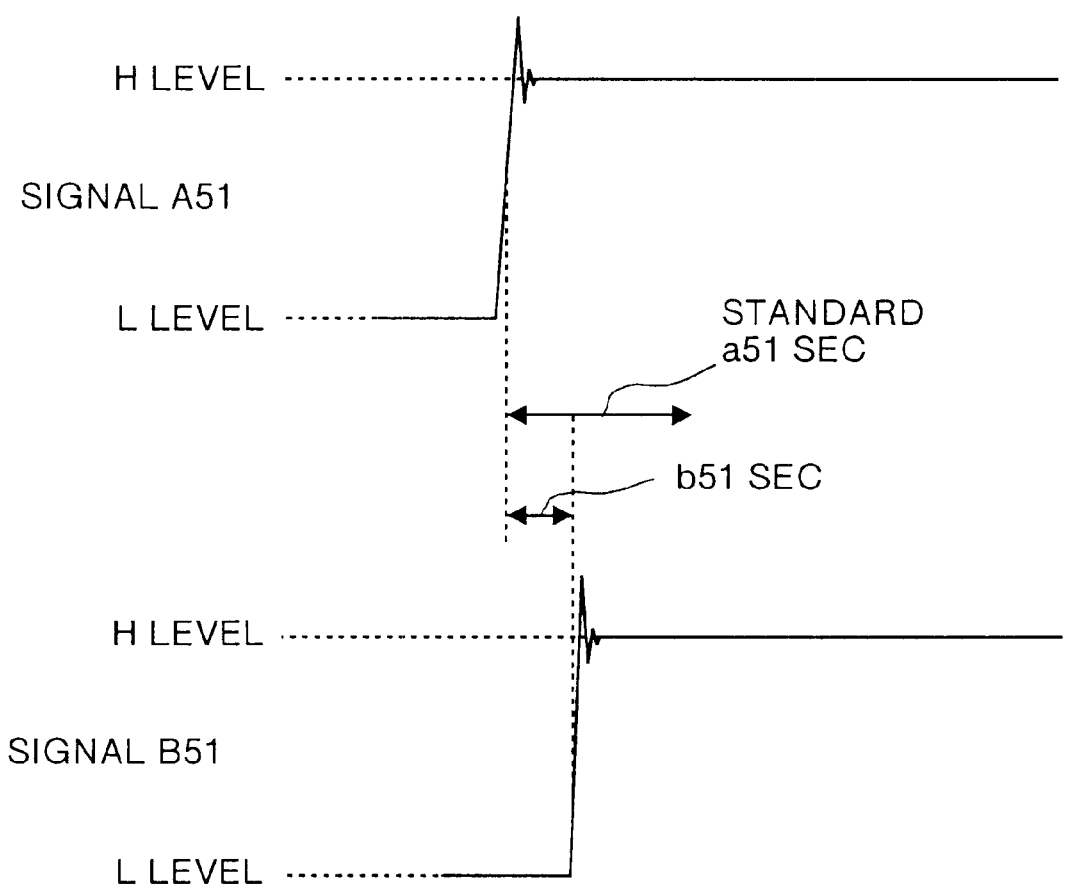
FIG. 22 is a timing chart showing one example of signals in conventional signal lines.
Figure 23:
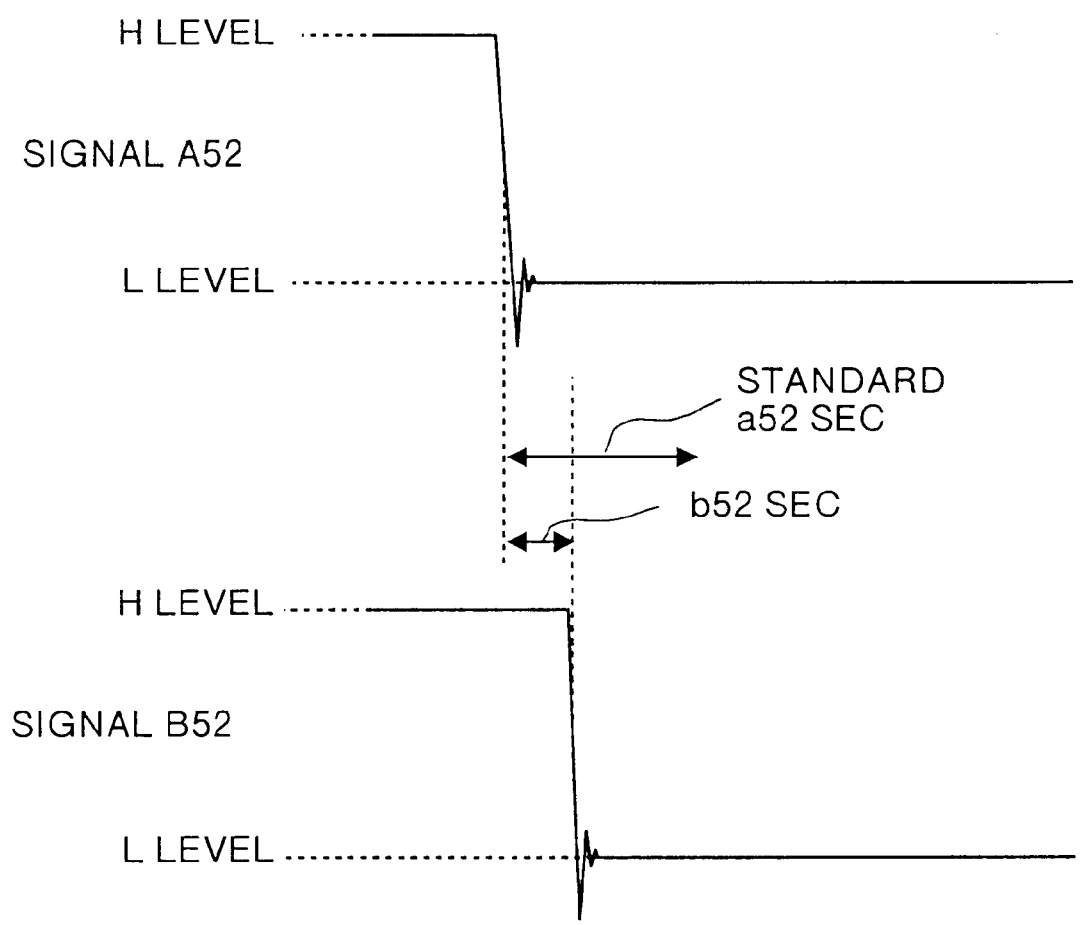
FIG. 23 is a timing chart showing another example of signals in conventional signal lines.
Figure 24:
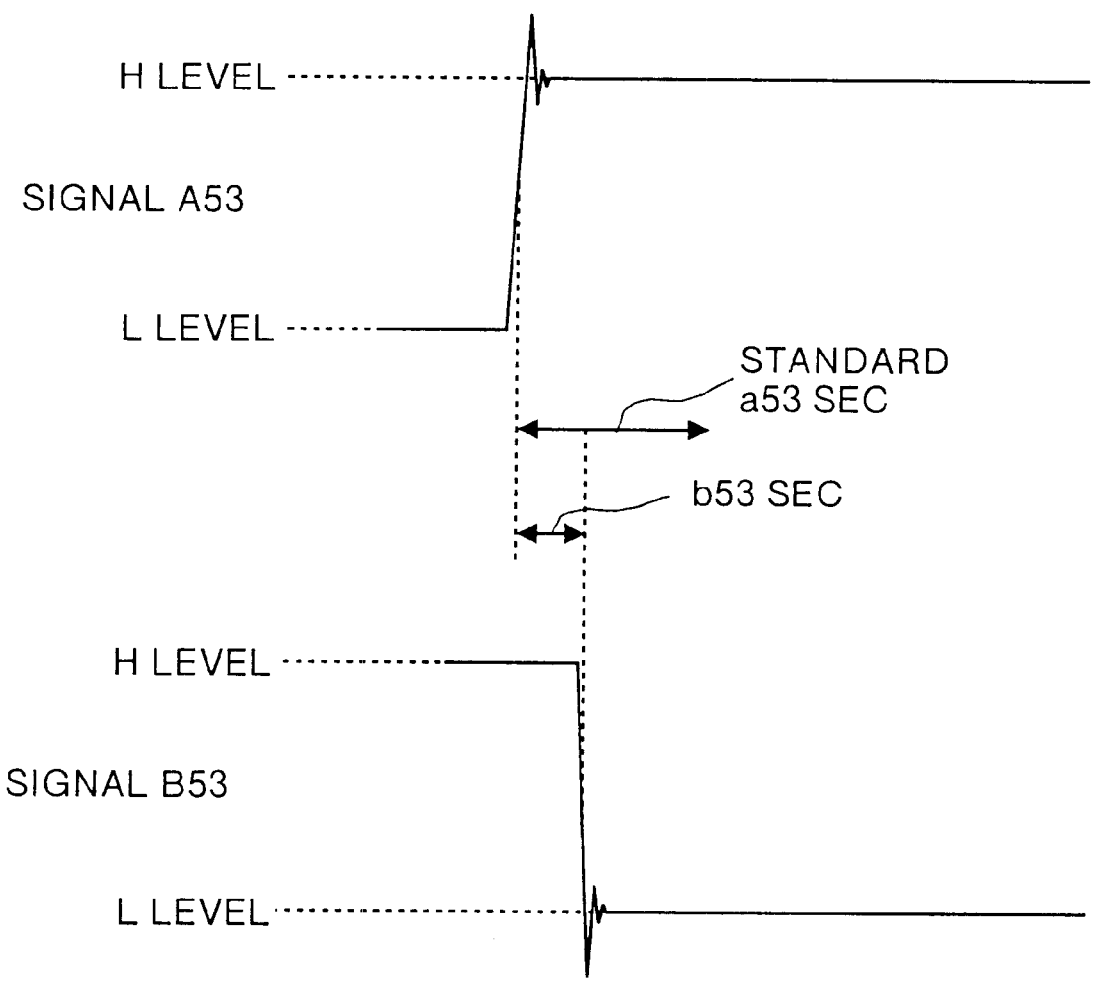
FIG. 24 is a timing chart showing still another example of signals in conventional signal lines.

FIG. 20 is a timing chart showing still another example of signals that flow through the signal lines 41 and 42 relating to the fifth embodiment. It is assumed, for example, that there is a prescribed standard of a43 sec as a gap between a timing that a signal A43 that flows through the signal line 41 rises from a low level to a high level and a timing that a signal B43 that flows through the signal line 42 falls from a high level to a low level. Since these signal lines are provided with one or a plurality of parallel paths in this semiconductor integrated circuit, the signal A43 rises gently and the signal B43 falls gently. As a consequence, a timing gap b43 sec between the signal lines becomes only slightly smaller than the standard timing gap of a43 sec. Thus, since the signal A43 rises gently and the signal B43 falls gently, overshoot or undershoot does not occur.

As described above, according to the fifth embodiment, as the signal lines are provided with one or a plurality of parallel paths to maximize a gap in timing between the signal lines within a predetermined standard thereby slowing a rise and a fall of signals, it is possible to reduce noise by suppressing the occurrence of an overshoot and an undershoot.

A computer program for realizing the above-described wiring methods for a semiconductor apparatus relating to the first to fifth embodiments can also be stored into a portable recording medium such as a magnetic disk like a floppy disk, a semiconductor memory (including that incorporated in a cartridge or a PC card) like a ROM, an EPROM, an EEPROM, a flash ROM, etc., an optical disk like a CD-ROM, a DVD, etc, or an optical magnetic disk like an MO, etc. Then, the program recorded on this recording medium may be installed onto a fixed recording medium like a ROM, a RAM, a hard disk, etc. that are incorporated in an automatic wiring apparatus.

Further, this program can also be transmitted via a network like a LAN, a WAN, Internet, etc., and installed onto the fixed recording medium for the automatic wiring apparatus. This program is not necessarily limited to a one formed in a single structure, but may also be formed in a distributed structure as a plurality of modules and libraries. The program may also be a one that achieves its function in co-operation with separate programs of an OS and the like.

As explained above, according to the present invention, as the signal lines are wired to maximize a gap in timing between the signal lines within a predetermined standard thereby slowing a rise and a fall of signals, it is possible to reduce noise by suppressing the occurrence of an overshoot and an undershoot.

Further, according to the present invention, as the lengths of signal lines are extended to maximize a gap in timing between the signal lines within a predetermined standard thereby slowing a rise and a fall of signals, it is possible to reduce noise by suppressing the occurrence of an overshoot and an undershoot.

Further, according to the present invention, as the widths of signal lines are expanded to maximize a gap in timing between the signal lines within a predetermined standard thereby slowing a rise and a fall of signals, it is possible to reduce noise by suppressing the occurrence of an overshoot and an undershoot.

Further, according to the present invention, as one or a plurality of through-holes are provided on at least one of the signal lines to maximize a gap in timing between the signal lines within a predetermined standard thereby slowing a rise and a fall of signals, it is possible to reduce noise by suppressing the occurrence of an overshoot and an undershoot.

Further, according to the present invention, as one or a plurality of branches are provided on the signal lines to maximize a gap in timing between the signal lines within a predetermined standard thereby slowing a rise and a fall of signals, it is possible to reduce noise by suppressing the occurrence of an overshoot and an undershoot.

Further, according to the present invention, as the signal lines are provided with one or a plurality of parallel paths to maximize a gap in timing between the signal lines within a predetermined standard thereby slowing a rise and a fall of signals, it is possible to reduce noise by suppressing the occurrence of an overshoot and an undershoot.

Further, according to the present invention, as a program for making the computer execute the method relating to the invention has been recorded on a recording medium, the computer can read this program and execute this method relating to the invention.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method for wiring a semiconductor integrated circuit including laying out signal lines to maximize a gap between times when signals in the signal lines change logic state yet remain within a standard maximum gap.

2. A method for wiring a semiconductor integrated circuit wherein lengths of signal lines are extended to maximize a gap between times when signals in the signal lines change logic state yet remain within a standard maximum gap.

3. A method for wiring a semiconductor integrated circuit wherein widths of signal lines are increased to maximize a gap between times when signals in the signal lines change logic state yet remain within a standard maximum gap.

4. A method for wiring a semiconductor integrated circuit wherein at least one through-hole is provided in each signal line to maximize a gap between times when signals in the signal lines change logic state yet remain within a standard maximum gap.

5. A method for wiring a semiconductor integrated circuit wherein signal lines are branched to maximize a gap between times when signals in the signal lines change logic state yet remain within a standard maximum gap.

6. A method for wiring a semiconductor integrated circuit wherein signal lines include at least one parallel route to maximize a gap between times when signals in the signal lines change logic state yet remain within a standard maximum gap.

7. A computer-readable recording medium storing a program for making a computer lay out signal lines of a semiconductor integrated circuit to maximize a gap between times when signals in the signal lines change logic state yet remain within a standard maximum gap.

8. A computer-readable recording medium storing a program for making a computer program extend lengths of signal lines to maximize a gap between times when signals in the signal lines change logic state yet remain within a standard maximum gap.

9. A computer-readable recording medium storing a program for making a computer program increase widths of signal lines to maximize a gap between times when signals in the signal lines change logic state yet remain within a standard maximum gap.

10. A computer-readable recording medium storing a program for making a computer program drill at least one through-hole through signal lines to maximize a gap between times when signals in the signal lines change logic state yet remain within a standard maximum gap.

11. A computer-readable recording medium storing a program for making a computer program branch signal lines to maximize a gap between times when signals in the signal lines change logic state yet remain within a standard maximum gap.

12. A computer-readable recording medium storing a program for making a computer program provide at least one parallel route to signal lines to maximize a gap between times when signals in the signal lines change logic state yet remain within a standard maximum gap.

13. A wiring method for a semiconductor integrated circuit, the semiconductor integrated circuit having a standard for a timing gap between times when signals flowing in signal lines change logic levels, the method comprising laying out signal lines so that the difference between the standard and the timing gap between the times when signals flowing in the signal lines change logic levels is less than a maximum gap.

14. The wiring method according to claim 13, including adjusting lengths of said signal lines so that the difference between the standard and the gap is less than the maximum gap.

15. The wiring method according to claim 13, including adjusting widths of said signal lines so that the difference between the standard and the gap is less than the maximum gap.

16. The wiring method according to claim 13, including providing at least one through-hole in each of said signal lines so that the difference between the standard and the gap is less than the maximum gap.

17. The wiring method according to claim 13, including branching said signal lines so that the difference between the standard and the gap is less than the maximum gap.

18. The wiring method according to claim 13, including providing at least one parallel route for said signal lines so that the difference between the standard and the gap is less than the maximum gap.

19. The wiring method according to claim 13, wherein the maximum gap is 1 sec.

* * * * *